(12) United States Patent
Chen

(10) Patent No.: US 8,499,451 B2
(45) Date of Patent: Aug. 6, 2013

(54) METHOD FOR ASSEMBLING HEAT SINK

(75) Inventor: Chuan-Pei Chen, Taipei County (TW)

(73) Assignees: Rich Sphere Precision Industry Co., Ltd., New Taipei (TW); Shyh-Ming Chen, New Taipei (TW); Chiu-Tzu Chin, New Taipei (TW)

( * ) Notice: Subject to any disclaimer, the term of this patent is extended or adjusted under 35 U.S.C. 154(b) by 1001 days.

(21) Appl. No.: 12/555,060

(22) Filed: Sep. 8, 2009

(65) Prior Publication Data

US 2010/0162551 A1 Jul. 1, 2010

(30) Foreign Application Priority Data

Dec. 31, 2008 (TW) .............................. 97151576 A

(51) Int. Cl.
*B21D 53/02* (2006.01)
*B23P 11/00* (2006.01)

(52) U.S. Cl.
USPC ............................. 29/890.03; 29/505; 29/428

(58) Field of Classification Search
USPC ......... 29/890.03, 890.039, 890.045, 890.046, 29/283.5, 428, 445, 505, 509, 513, 787, 788, 29/33 G; 165/80.2, 80.3, 104.33, 185, DIG. 522; 72/253.1, 264, 273, 347, 352, 358, 360, 72/361, 362, 467, 469, 470
See application file for complete search history.

(56) References Cited

U.S. PATENT DOCUMENTS

| | | | | |
|---|---|---|---|---|
| 2,778,610 | A | * | 1/1957 | Bruegger ...................... 126/109 |
| 3,148,441 | A | * | 9/1964 | Schuler .................... 29/890.048 |
| 7,827,688 | B2 | * | 11/2010 | Chen .......................... 29/890.03 |
| 2010/0126697 | A1 | * | 5/2010 | Huang ......................... 165/80.3 |

\* cited by examiner

*Primary Examiner* — Sarang Afzali
(74) *Attorney, Agent, or Firm* — Chun-Ming Shih; HDLS IPR Services

(57) ABSTRACT

A method for assembling a heat sink with radial fins is disclosed. The heat sink includes a thermo-conductive base and a fin set. The base is provided with a plurality of troughs and guiding grooves. Each guiding groove is located between two adjacent troughs. The fin set is composed of a plurality of fins. The method provides a mold having a star shaped inner space and edges. The heat sink is compressed into the inner space and the guiding grooves are inserted by the edges to make the troughs deformed. The fins are firm pinched by deformed troughs.

4 Claims, 14 Drawing Sheets

METHOD FOR ASSEMBLING HEAT SINK

BACKGROUND OF THE INVENTION

1. Technical Field

The invention generally relates to heat sinks, and in particularly to a method and a structure for assembling heat sinks used in electronic devices such as computers.

2. Related Art

Usually, a heat sink used for integrated circuits or electric devices includes a base plate and fins. The base plate is provided with a plurality of troughs for being inserted by the fins separately. Referring to FIG. 1, the conventional method for assembling fins on the base plate of heat sink 1 is to form troughs 11 on the base plate 10 first. The base plate 10 is mounted on a tool (not shown) and aligned with the underside of a mold 12. The mold 12 has a plurality of punches 13 driven by a press machine to reciprocate. Each punch 13 is just located between two adjacent fins 14 and strikes the surface of the base plate 10 near the fins 14 to make it deformed, so that the fins 14 can be fixed on the base plate 10.

However, to improve heat dissipation efficiency and increase heat dissipation area, the fins 14 disposed on the base plate 10 are dense and a gap between two adjacent fins is very narrow. Therefore, the punches 13 must be very thin. Thin punches 13 do not have enough strength and tend to be broken. Also, front edges of the punches 13 become dull easily.

SUMMARY OF THE INVENTION

A primary object of the invention is to provide a method and a structure for assembling a heat sink which can decrease breakdown of the punches and reduce manufacturing costs.

Another object of the invention is to abate vibration and noise during manufacturing process.

Another object of the invention is to improve accuracy and yield rate.

To accomplish the abovementioned objects, the method for assembling a heat sink according to the present invention is provided. The heat sink includes a thermo-conductive base and a fin set. The base is provided with a plurality of troughs and guiding grooves. Each guiding groove is located between two adjacent troughs. The fin set is composed of a plurality of fins. The method provides a mold having a star shaped inner space and edges. The heat sink is compressed into the inner space and the guiding grooves are inserted by the edges to make the troughs deformed. The fins are firmly pinched by deformed troughs.

Another embodiment of the invention provides a tool for being mounted by the heat sink, and the mold is mounted on a machine. The mold is pushed by a reciprocating motion of the machine to be slidedly embedded by the heat sink. The edges of the mold compress the guiding grooves of the heat sink to deform both sides of the troughs. Then the deformed troughs pinch the fins to integrate.

A further embodiment of the invention provides a structure for assembling a heat sink, which comprises: a heat-conductive annular base having a plurality of trough thereon and guiding grooves separately disposed between every two adjacent troughs; and a fin set having a plurality of fins separately inserted into the troughs.

DETAILED DESCRIPTION OF THE INVENTION

Figure 1:
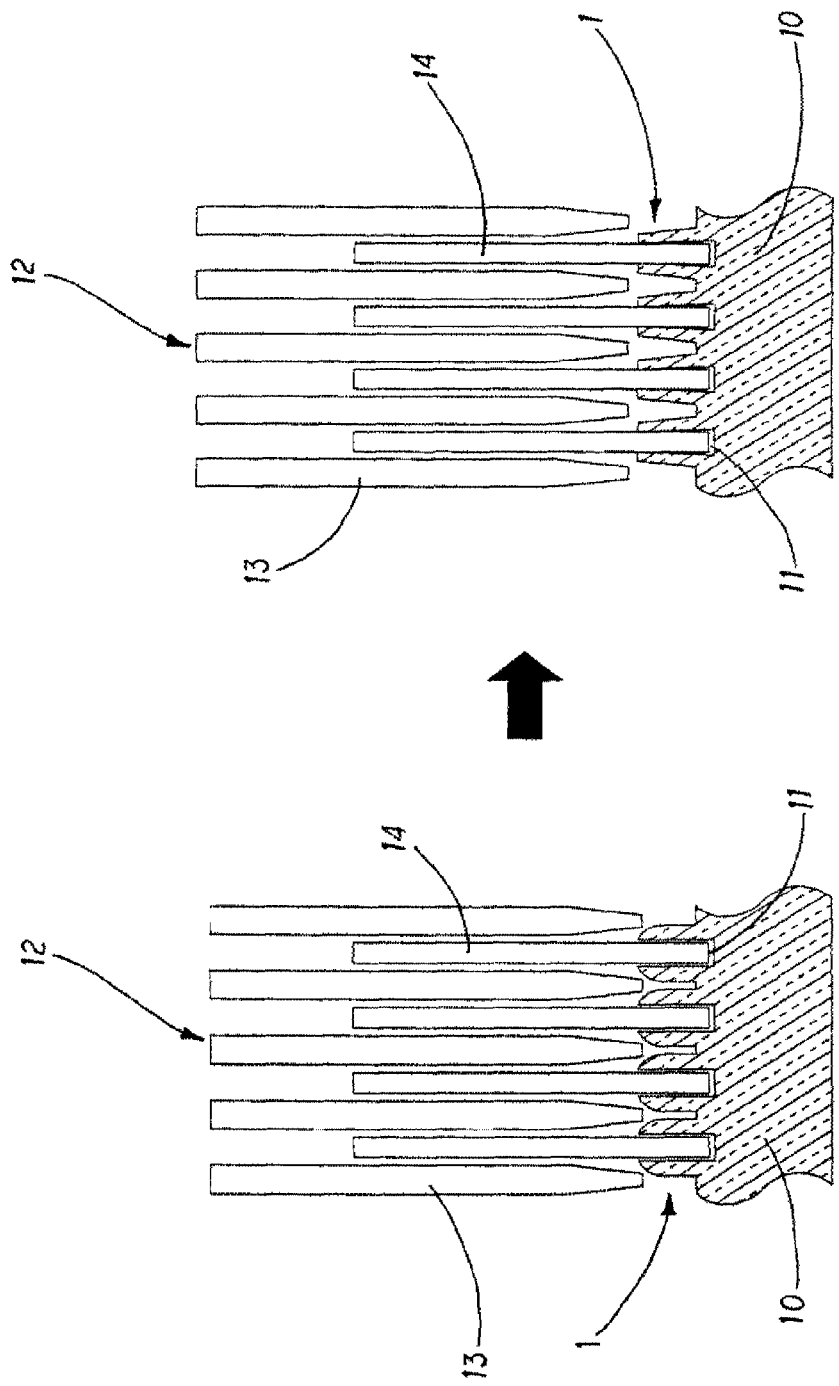
FIG. 1 shows a conventional method for assembling a heat sink.
Figure 2:
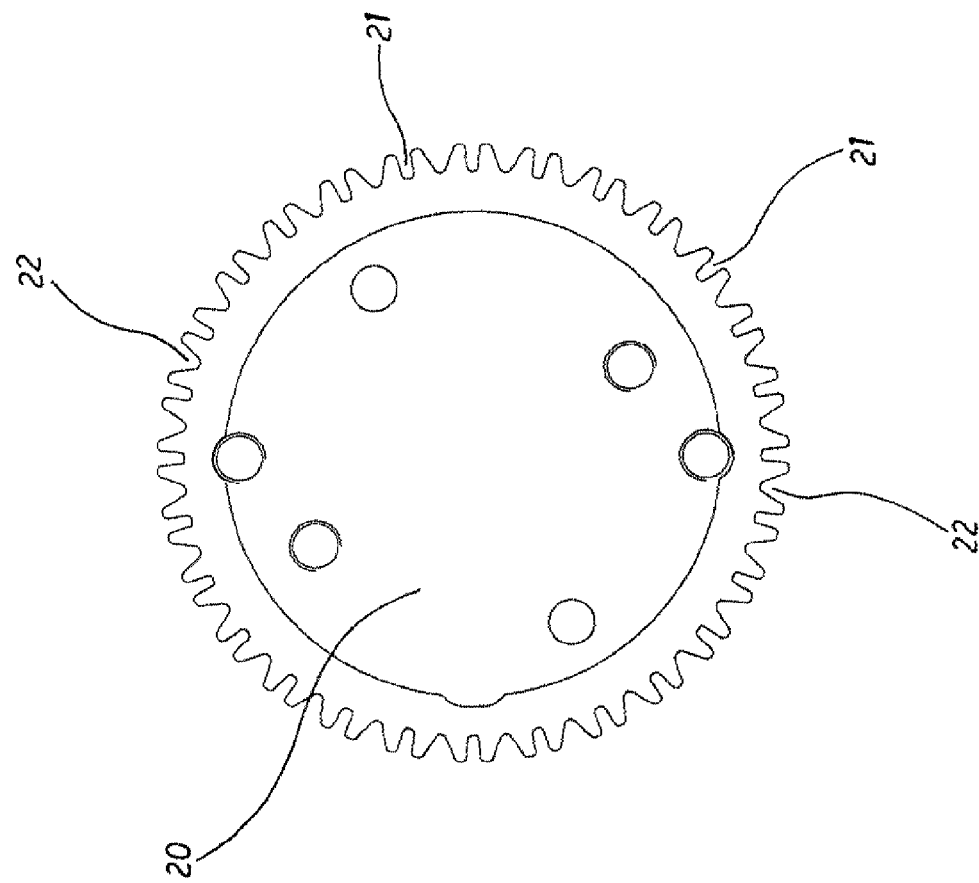
FIG. 2 shows the base of the invention.
Figure 2:
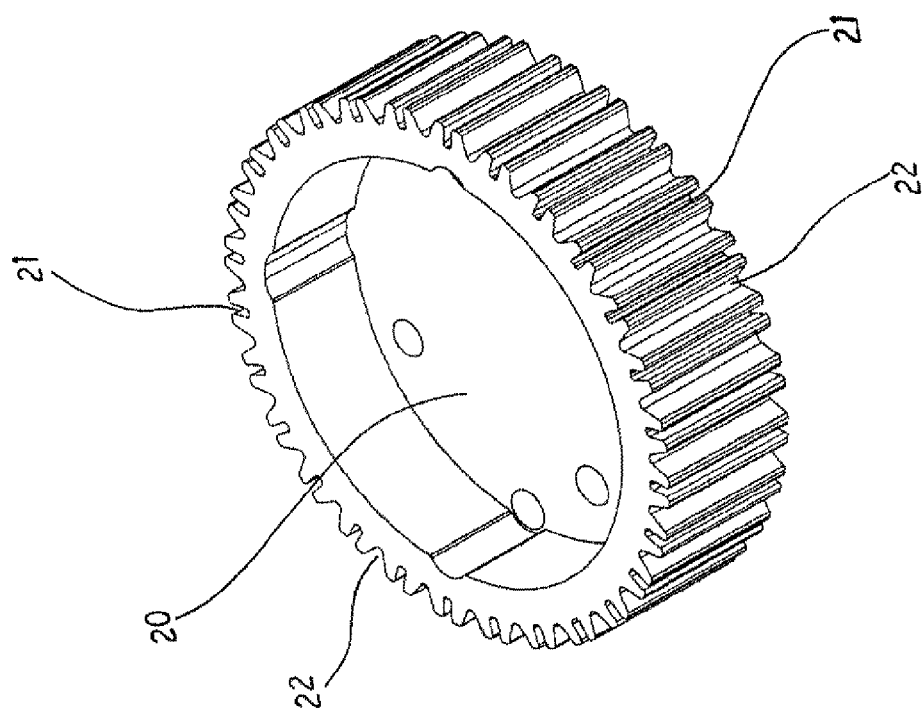
Figure 3:
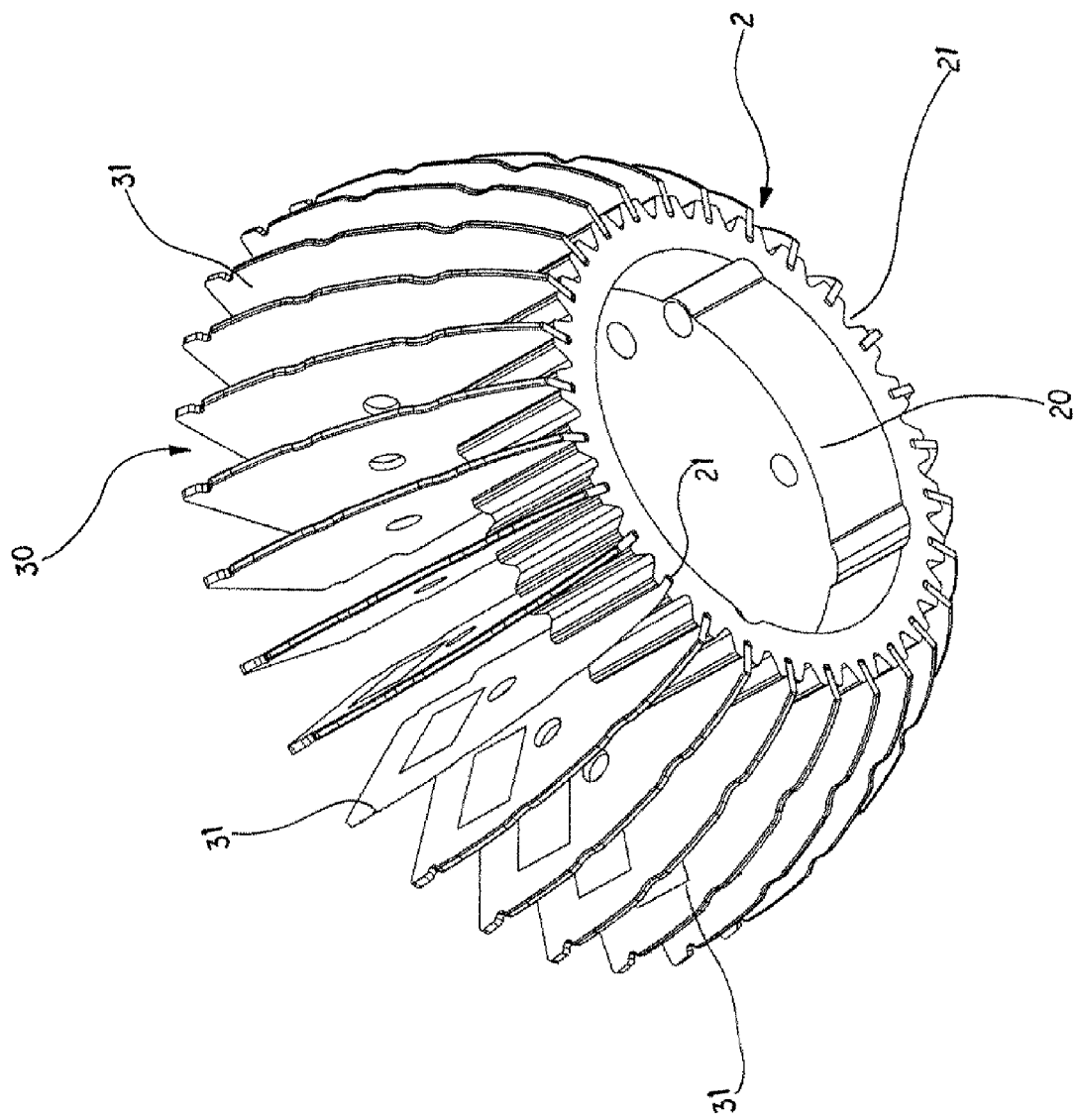
FIG. 3 is a perspective view of an assembly of the base and fins.
Figure 4:
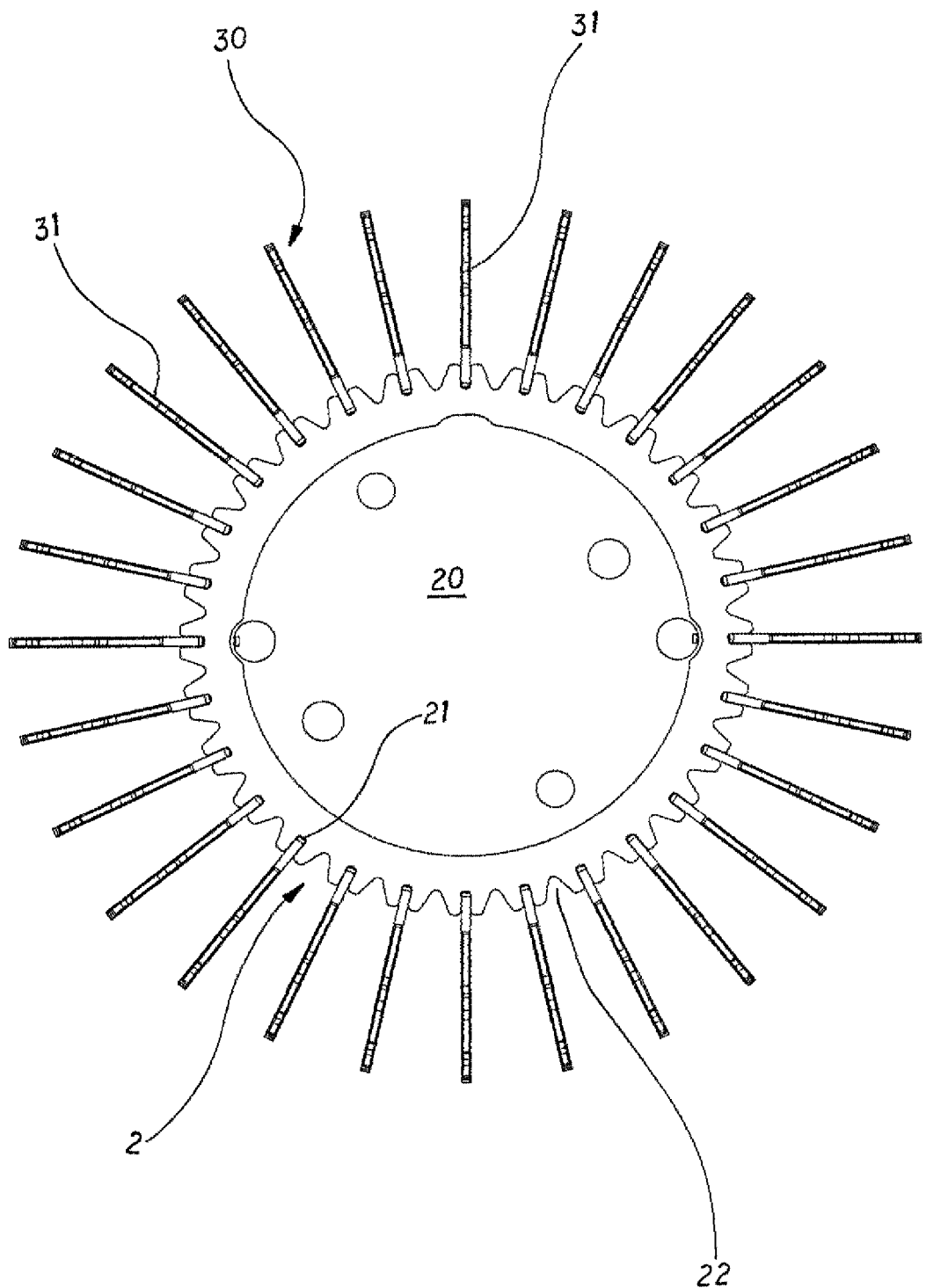
FIG. 4 is a top view of an assembly of the base and fins.
Figure 5:
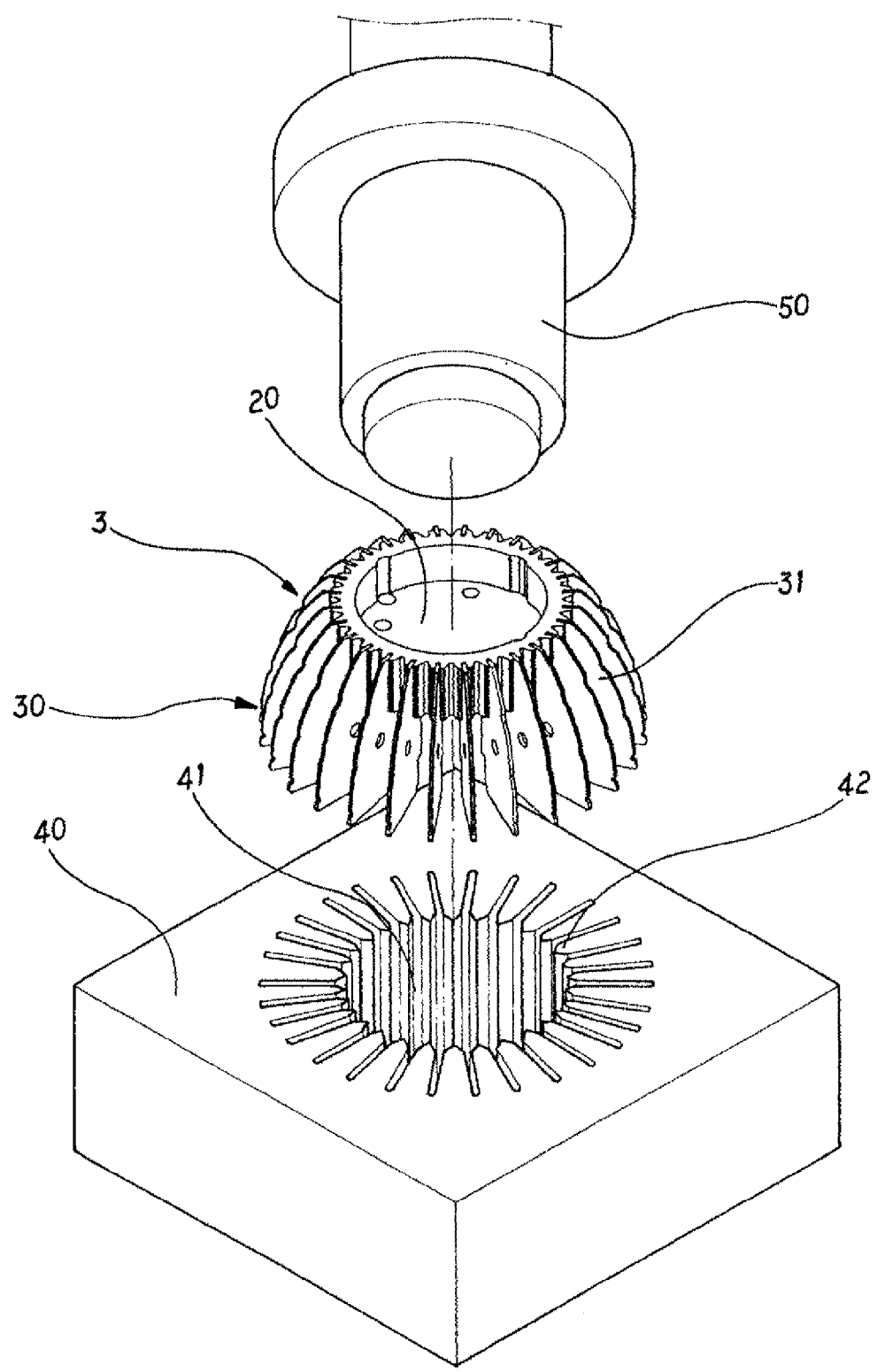
FIG. 5 shows the process of the assembling method of the invention.
Figure 6:
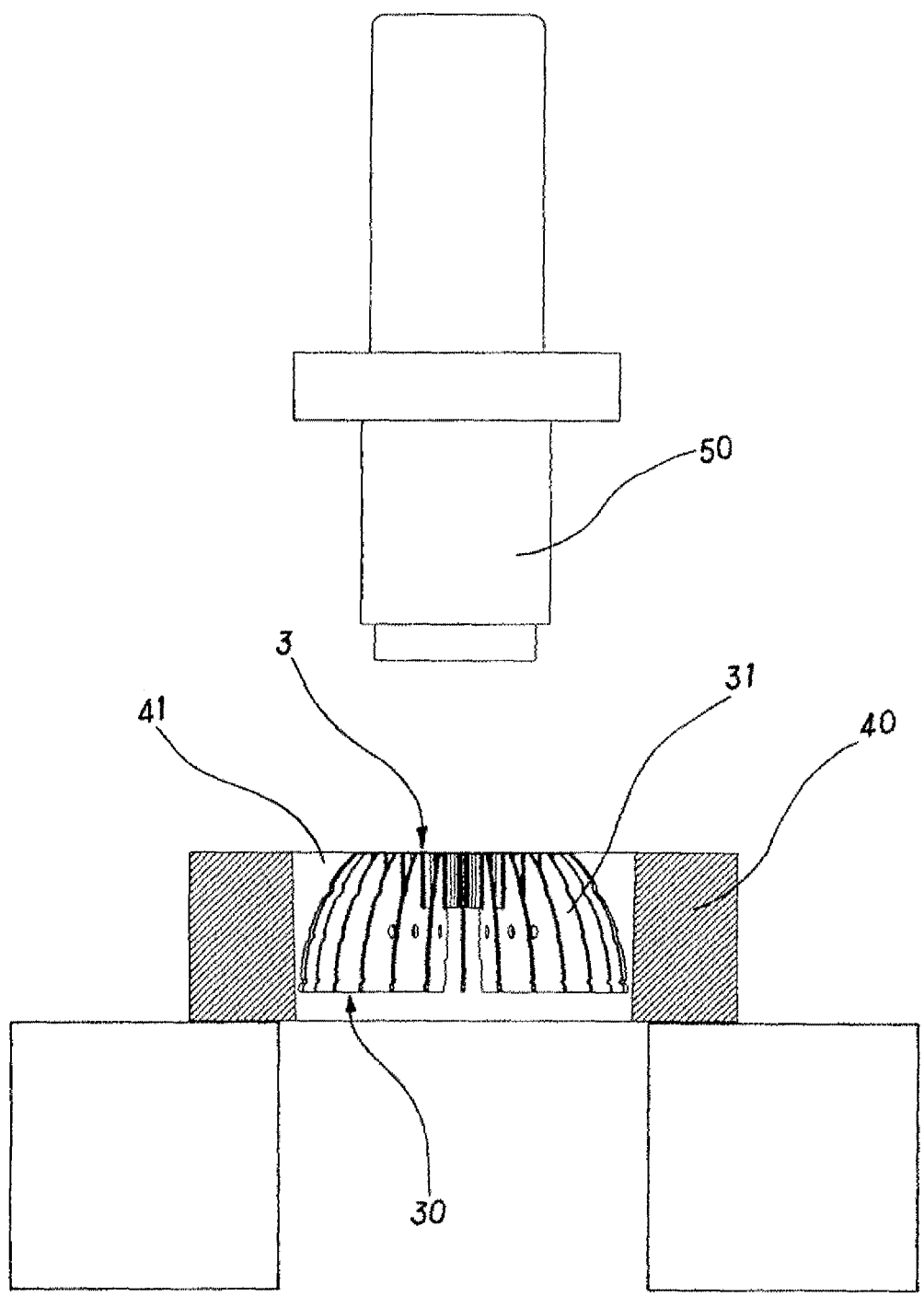
FIG. 6 is a side view of FIG. 5.
Figure 7:
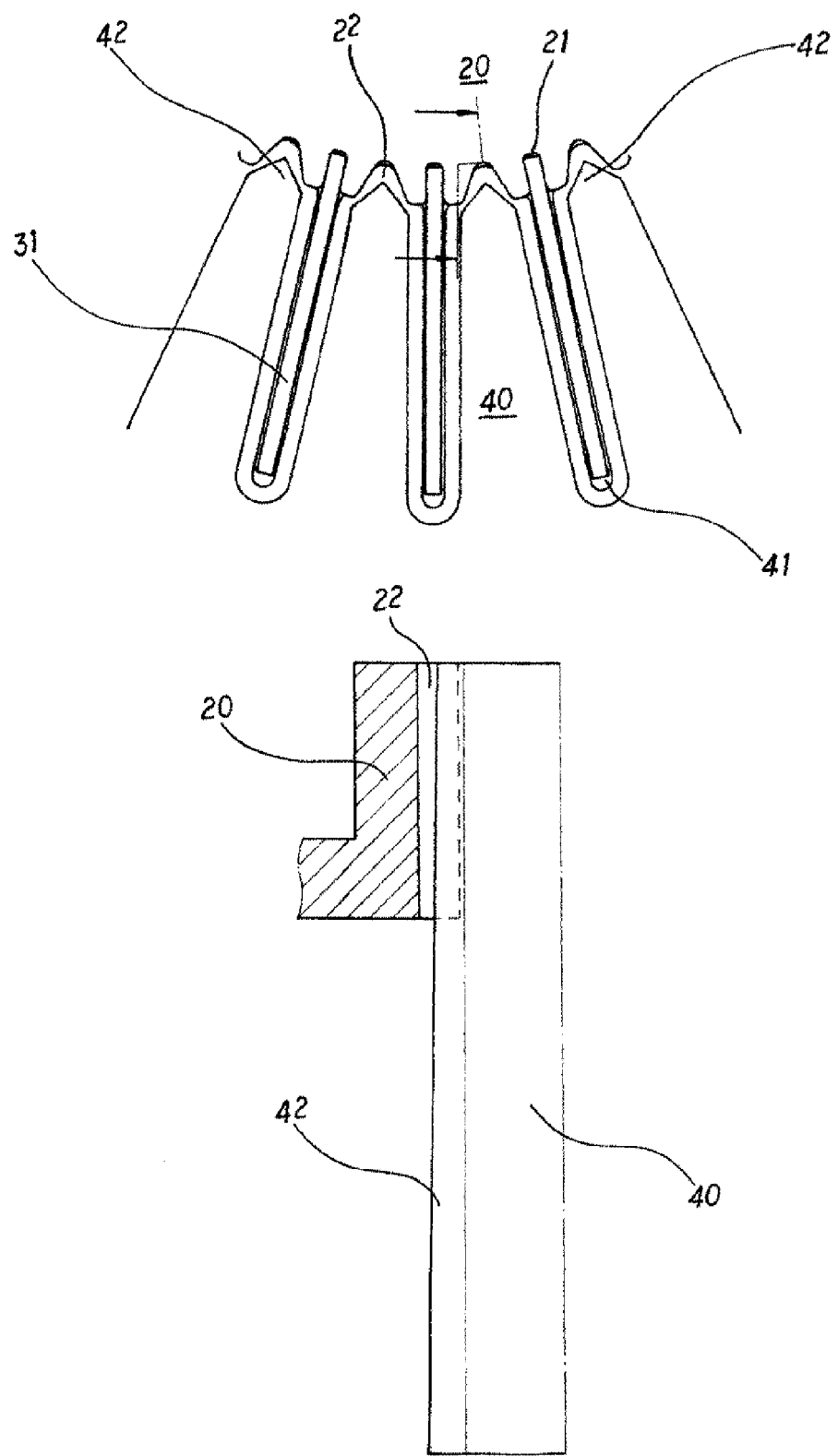
FIG. 7 is a top view and a side view of the status that the heat sink is placed on the mold but not assembled yet.
Figure 8:
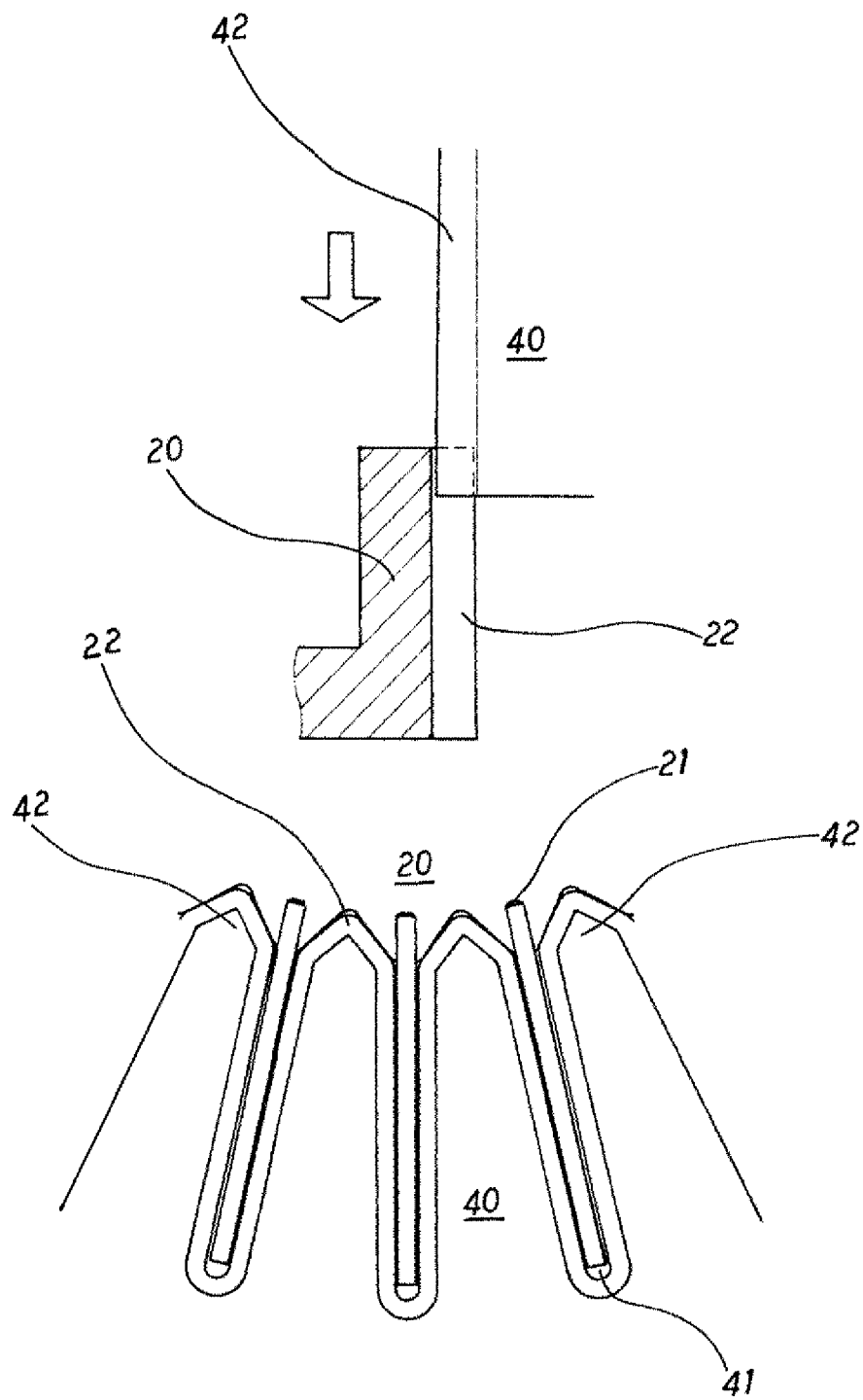
FIG. 8 is a top view and a side view of the status that the heat sink placed on the mold is moving.

Referring to FIGS. 2-4, the method for assembling a heat sink includes the steps of:

a) providing a thermo-conductive base 20. In a preferred embodiment shown in the figures, the base 20 is, but not limited to, an annular body. A plurality of troughs 21 are provided on outer surface of the base 20. A guiding groove 22 is disposed between every two adjacent troughs 21. A section of the guiding groove 22 is substantially V or U shaped.

b) providing a fin set 30 having a plurality of fins 31, wherein the fins 31 are separately inserted into the troughs 21 to form a heat sink 3.

c) providing a mold 40 having an inner space 40 for accommodating the heat sink 3 and edges 42 separately corresponding to the guiding grooves 22.

d) performing a tight connection process, wherein the heat sink 3 is placed in the inner space 41 of the mold 40, a tool 50 driven by a punch press (not shown) pushes the heat sink 3 to be inserted into the inner space 41 (as shown in FIGS. 5 and 6) and the edges 42 are longitudinally inserted into the guiding grooves 22 (as shown in FIGS. 7 and 8), and then one sides of the guiding grooves 22 are deformed by the edges 42 to make the troughs 21 shrink inwardly for firmly pinching the fins 31.

Figure 9:
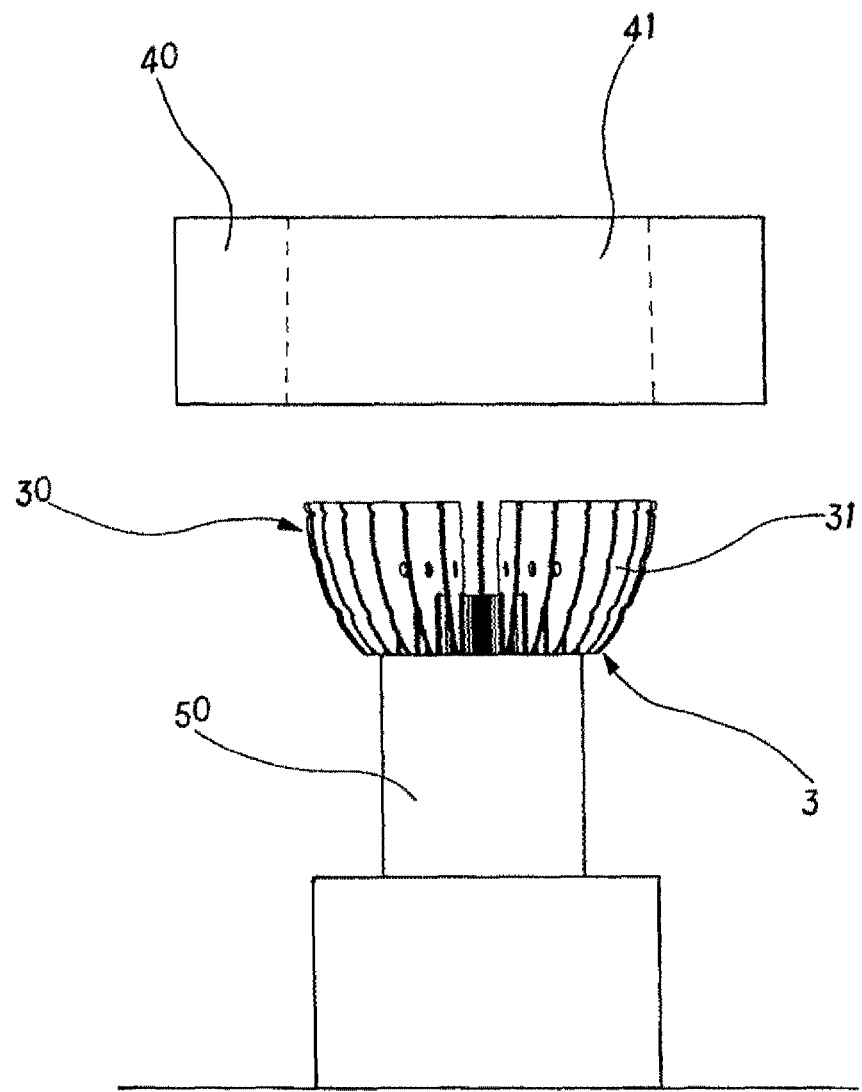
FIG. 9 shows another embodiment of the assembling method of the invention.

FIG. 9 shows another embodiment of the invention which includes the steps of:

a) providing a thermo-conductive base 20 having troughs 21 on outer surface thereof and V or U shaped guiding grooves 22 disposed between every two adjacent troughs 21.

b) providing a fin set 30 having a plurality of fins 31, wherein the fins 31 are separately inserted into the troughs 21 to form a heat sink 3.

c) providing a mold 40 having an inner space 40 for accommodating the heat sink 3 and edges 42 separately corresponding to the guiding grooves 22.

d) performing a tight connection process, wherein the heat sink 3 is placed on a tool 50 and the mold 40 is mounted on a punch press (not shown), the heat sink 3 is inserted into the inner space 41 and the edges 42 are longitudinally inserted into the guiding grooves 22 (as shown in FIGS. 7 and 8) by the punch press pushing the mold 40 to move forward, and then one sides of the guiding grooves 22 are deformed by the edges 42 to make the troughs 21 shrink inwardly for firmly pinching the fins 31.

Figure 10:
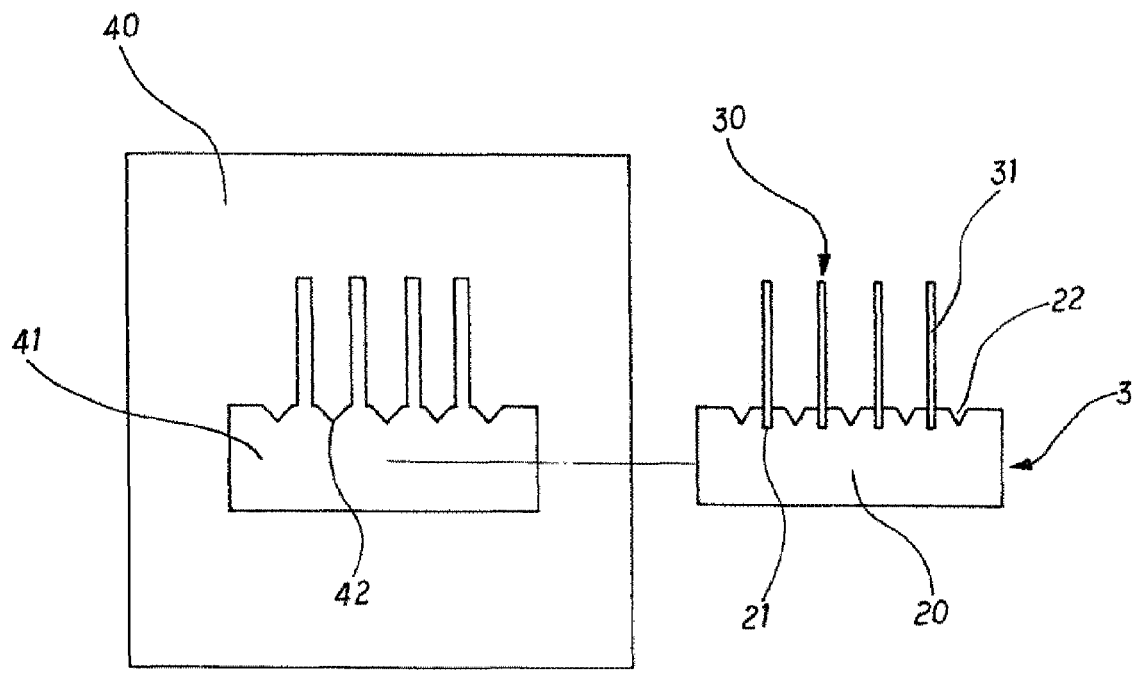
FIGS. 10 and 11 show heat sinks made by the method of the invention.
Figure 11:
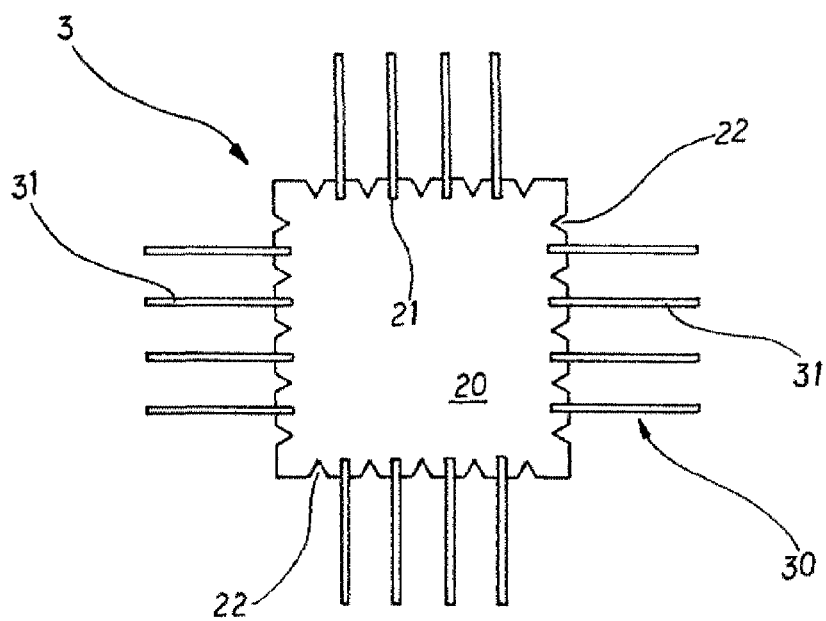
Figure 12:
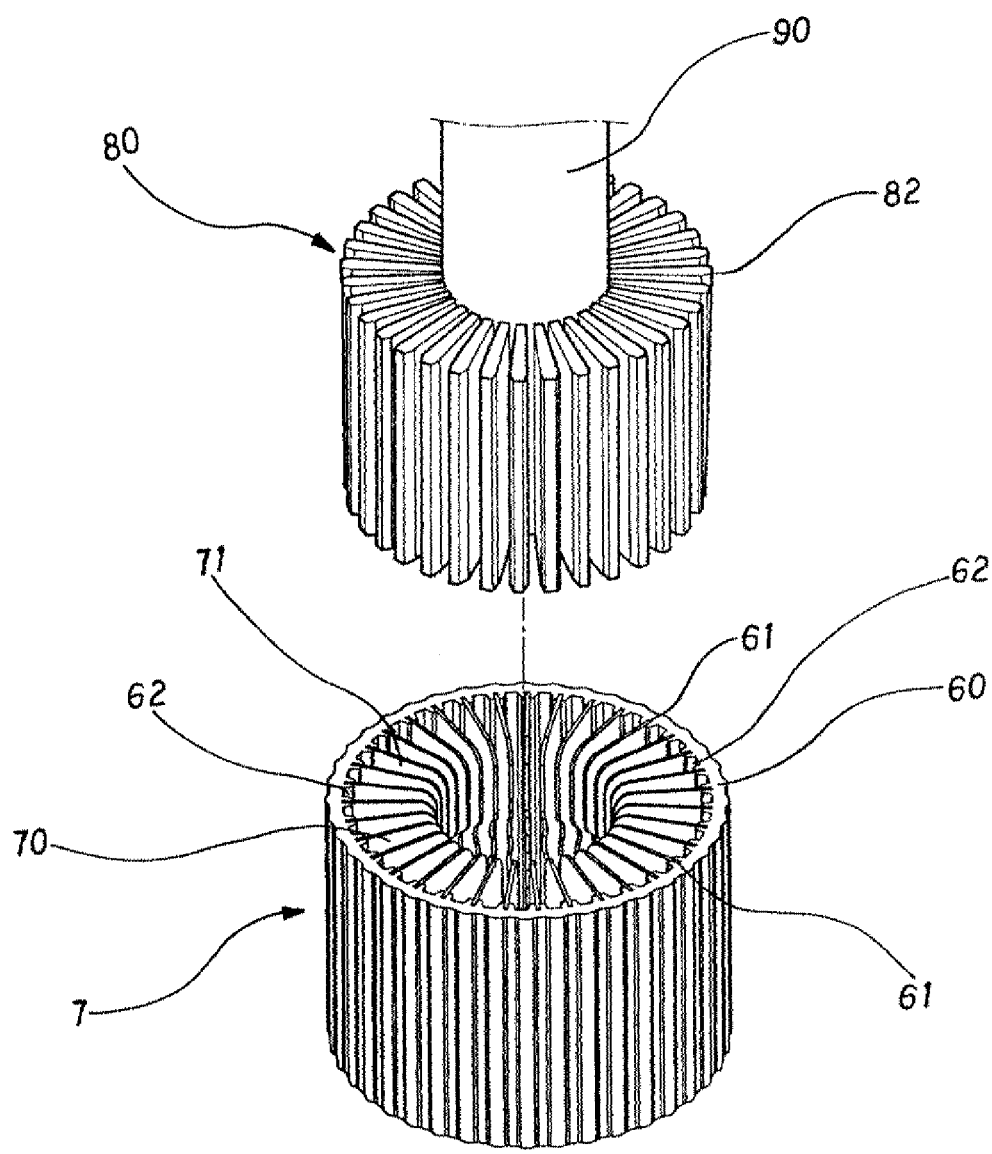
FIG. 12 shows the heat sink and mold of the third embodiment of the invention.

By performing the above method, various types of heat sinks as shown in FIGS. 10 and 11 can be produced for satisfying different requirements of computers or electric devices.

Figure 13:
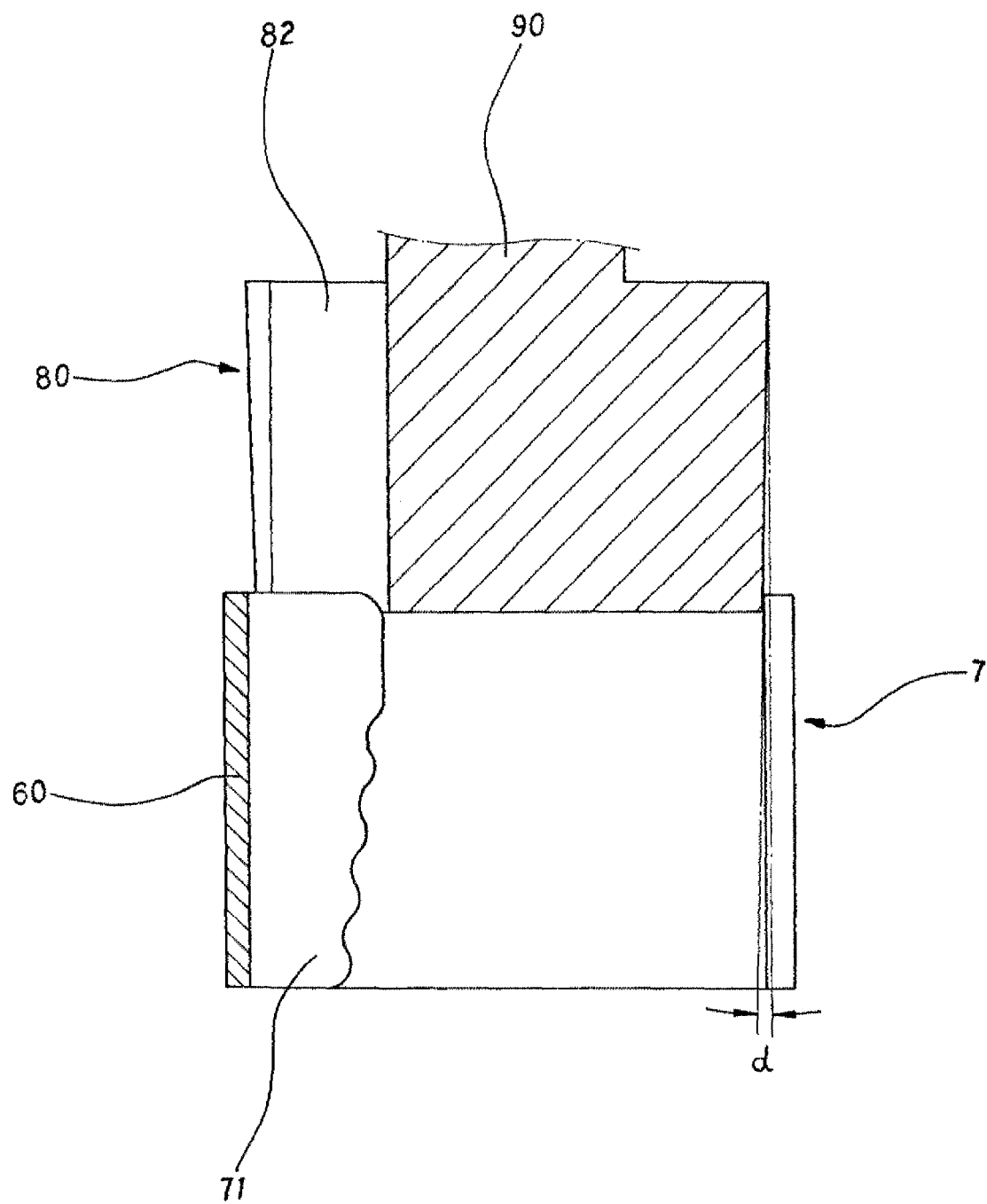
FIG. 13 shows the status that the mold is placed on the tool to prepare to press the heat sink, wherein the trough has not been deformed yet.
Figure 14:
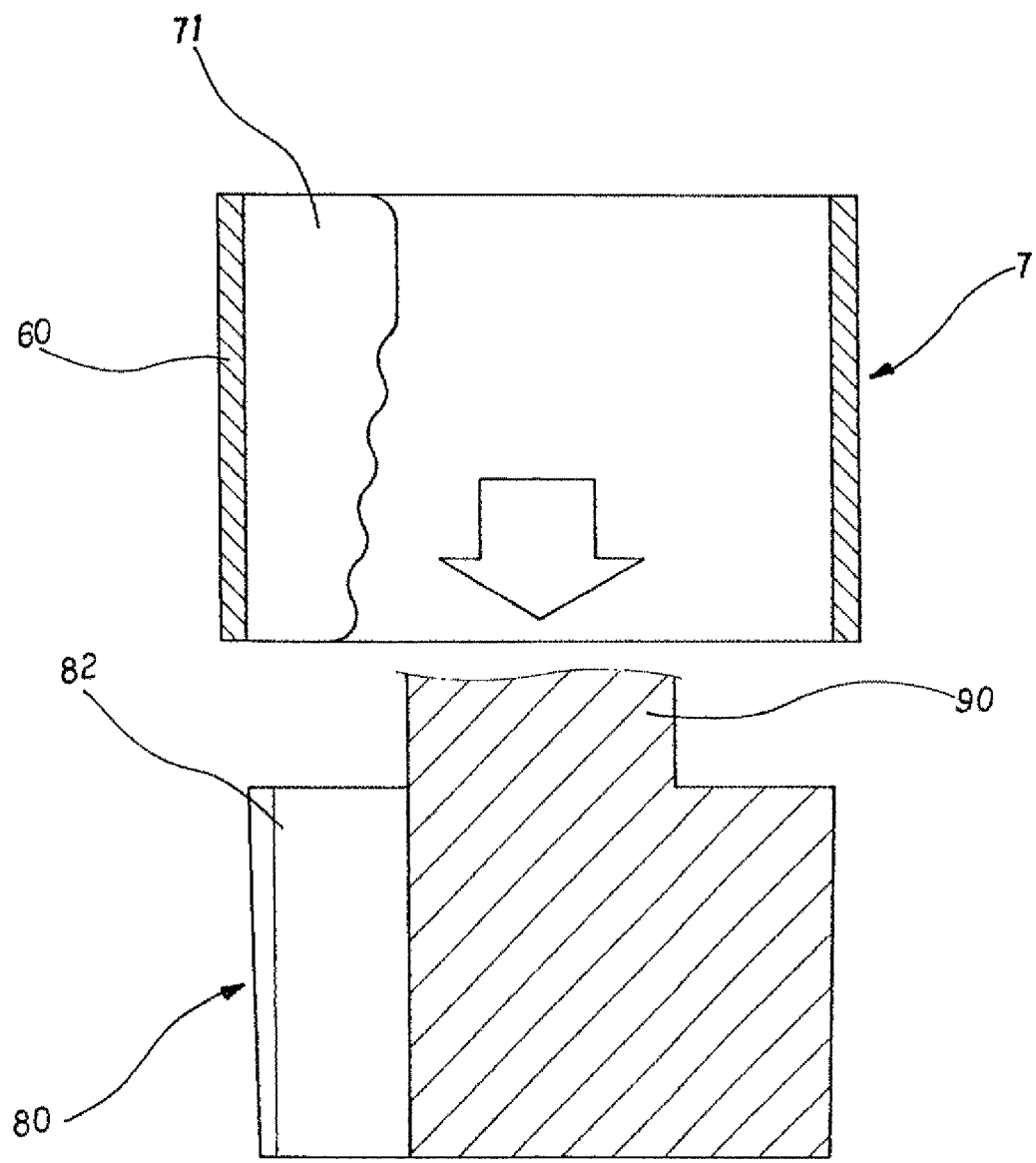
FIG. 14 shows the trough has been deformed because of compression.
Figure 15:
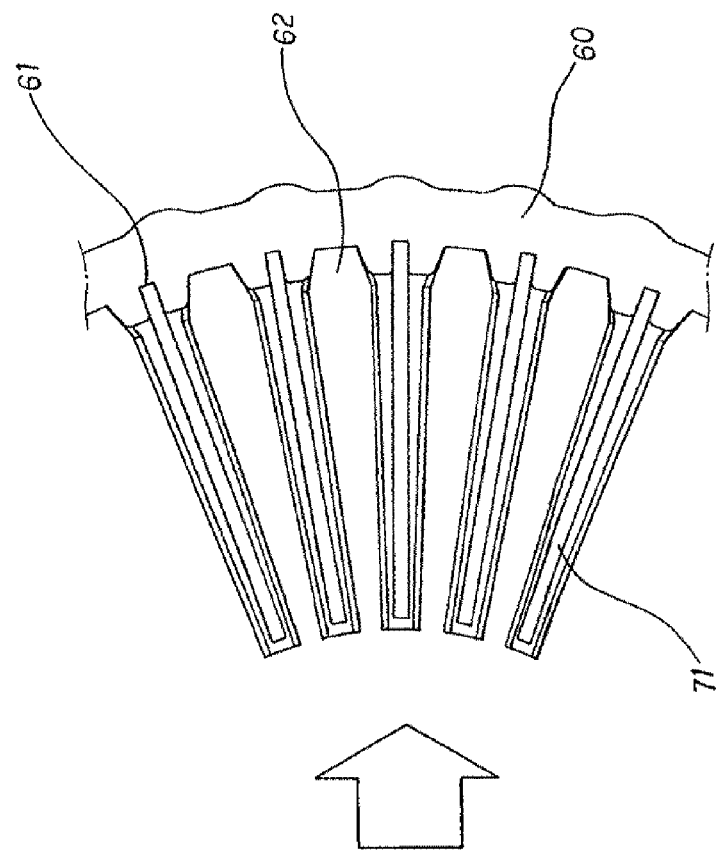
FIG. 15 shows a motion of the mold placed on the tool for making the troughs deformed in the third embodiment.
Figure 15:
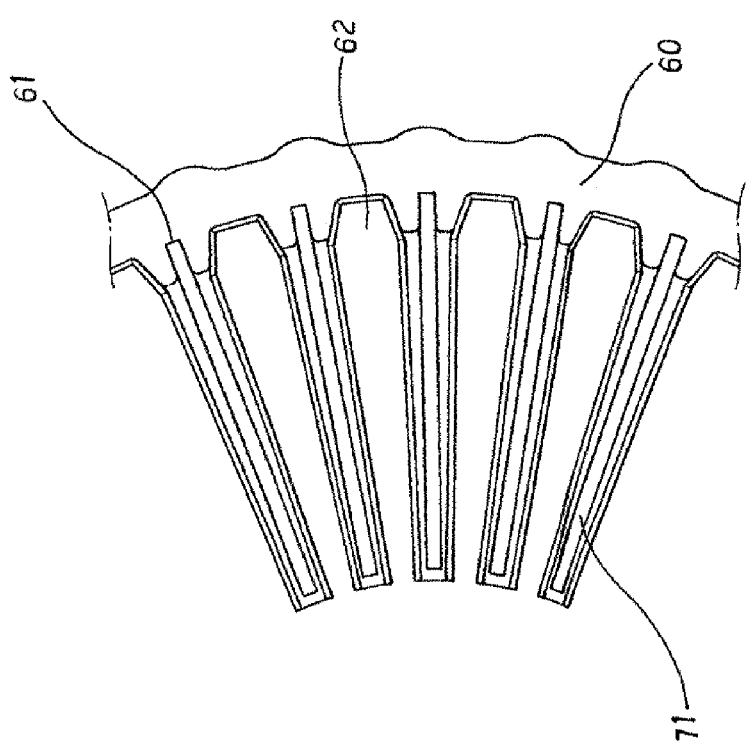

FIGS. 12 to 15 show another embodiment of the invention which includes the steps of:

a) providing an annular thermo-conductive base 60 having troughs 61 on surface of inner space thereof and guiding grooves 62 disposed between every two adjacent troughs 61.

b) providing a fin set 70 having a plurality of fins 71 and an inner space, wherein the fins 71 are separately inserted into the troughs 61 to form a heat sink 7.

c) providing a mold 80 having radial wings 82 separately corresponding to the guiding grooves 62.

d) performing a tight connection process, wherein the mold 80 is fixed on a tool 90 driven by a punch press as shown in FIGS. 13 and 14, the heat sink 7 is inserted by the mold 80 and the wings 82 are longitudinally inserted into the guiding grooves 62 (as shown in FIG. 15) by the punch press pushing the tool 90 to move forward, and then one sides of the guiding grooves 62 are deformed by the wings 42 with a depth d to make the troughs 61 shrink inwardly for firmly pinching the fins 71 in the base 60.

What is claimed is:

1. A method for assembling a heat sink, comprising steps of:
   a) providing an annular thermo-conductive base having a plurality of troughs thereon and guiding grooves separately disposed between every two adjacent troughs;
   b) providing a fin set having a plurality of fins, wherein the fins are separately inserted into the troughs to form a heat sink;
   c) providing a mold having an inner space for accommodating the heat sink and edges respectively corresponding to the guiding grooves; and
   d) performing a tight connection process, wherein the heat sink is placed in the inner space of the mold, a tool driven by a punch press pushes the heat sink passing through the inner space along a longitudinal direction and the edges are radially engaged with the guiding grooves, so that the guiding grooves are deformed by the edges to make the troughs shrink inwardly for firmly pinching the fins, respectively.

2. The method for assembling a heat sink of claim 1, wherein the the troughs and the guiding grooves are disposed on an outer surface of the annular base.

3. The method for assembling a heat sink of claim 1, wherein a section of each of the guiding grooves is U shaped.

4. The method for assembling a heat sink of claim 1, wherein a section of each of the guiding grooves is V shaped.

* * * * *